(12) United States Patent
Kim et al.

(10) Patent No.: US 10,355,069 B2
(45) Date of Patent: Jul. 16, 2019

(54) ORGANIC LIGHT EMITTING DIODE DISPLAY CAPABLE OF REDUCING RC LOAD

(71) Applicant: LG Display Co., Ltd., Seoul (KR)

(72) Inventors: Dosung Kim, Goyang-si (KR); Ryosuke Tani, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 15/658,774

(22) Filed: Jul. 25, 2017

(65) Prior Publication Data

US 2018/0033851 A1 Feb. 1, 2018

(30) Foreign Application Priority Data

Jul. 29, 2016 (KR) .......................... 10-2016-0097461

(51) Int. Cl.
*H01L 29/08* (2006.01)
*H01L 27/32* (2006.01)

(52) U.S. Cl.
CPC ........ *H01L 27/3279* (2013.01); *H01L 27/322* (2013.01); *H01L 27/3246* (2013.01); *H01L 27/3258* (2013.01); *H01L 27/3262* (2013.01); *H01L 27/3276* (2013.01); *H01L 27/3211* (2013.01); *H01L 2251/533* (2013.01); *H01L 2251/558* (2013.01)

(58) Field of Classification Search
CPC ... G01C 22/006; A41D 1/002; H01L 27/3279; H01L 27/322
USPC ............................................. 702/160; 257/40
See application file for complete search history.

(56) References Cited

U.S. PATENT DOCUMENTS

| 2003/0057419 A1 | 3/2003 | Murakami et al. |
| 2003/0057862 A1 | 3/2003 | Segawa |
| 2004/0041149 A1* | 3/2004 | Baek .................. G02F 1/13458 257/49 |

(Continued)

FOREIGN PATENT DOCUMENTS

| JP | 2000-260571 A | 9/2000 |
| JP | 2000-353809 A | 12/2000 |

(Continued)

OTHER PUBLICATIONS

Extended European Search Report dated Dec. 13, 2017, issued in corresponding European Patent Application No. 17183843.6.

(Continued)

*Primary Examiner* — Caleb E Henry
(74) *Attorney, Agent, or Firm* — Morgan, Lewis & Bockius LLP

(57) ABSTRACT

An organic light emitting diode display includes a substrate; a buffer layer on the substrate; a scan line running to a horizontal direction on the buffer layer; an intermediate insulating layer covering the scan line; a first trench having a segment shape apart from the scan line with a predetermined distance and exposing some of the substrate by patterning the intermediate insulating layer and the buffer layer; a data line running to a vertical direction on the substrate exposed by the first trench and on the intermediate insulating layer; a passivation layer covering the data line and the scan line; and a color filter filling into the trench and depositing on the passivation layer.

12 Claims, 5 Drawing Sheets

(56) References Cited

U.S. PATENT DOCUMENTS

| | | | | |
|---|---|---|---|---|
| 2009/0121228 A1* | 5/2009 | Kim | .................... | G02F 1/13458 |
| | | | | 257/59 |
| 2011/0127532 A1* | 6/2011 | Ahn | .................... | H01L 27/1288 |
| | | | | 257/59 |
| 2011/0164214 A1 | 7/2011 | Hwang | | |
| 2014/0027791 A1* | 1/2014 | Cho | ........................ | H01L 33/44 |
| | | | | 257/88 |
| 2015/0001543 A1* | 1/2015 | Moon | ................. | H01L 27/1244 |
| | | | | 257/72 |
| 2016/0027808 A1* | 1/2016 | Kim | .................... | H01L 27/1225 |
| | | | | 349/43 |
| 2016/0141349 A1 | 5/2016 | Yun et al. | | |
| 2016/0372491 A1* | 12/2016 | Liu | ........................ | H01L 27/124 |

FOREIGN PATENT DOCUMENTS

| | | |
|---|---|---|
| KR | 10-2014-0030289 A | 3/2014 |
| KR | 10-2016-0049173 A | 5/2016 |

OTHER PUBLICATIONS

Office Action dated Jul. 5, 2018, issued in corresponding Japanese Patent Application No. 2017-144199.

* cited by examiner

ORGANIC LIGHT EMITTING DIODE DISPLAY CAPABLE OF REDUCING RC LOAD

This application claims the benefit of Korea Patent Application No. 10-2016-0097461 filed on Jul. 29, 2016, which is incorporated herein by reference for all purposes as if fully set forth herein.

BACKGROUND

Technical Field

The present disclosure relates to an organic light emitting diode display, and more particularly, to a high quality organic light emitting diode display in which the load of the data line is lowered by enhancing the insulating property between the data line and the cathode electrode.

Discussion of the Related Art

Nowadays, various flat panel displays (or 'FPD') are developed for overcoming many drawbacks of the cathode ray tube (or 'CRT') which is heavy and bulky. The flat panel display devices include the liquid crystal display device (or 'LCD'), the field emission display (FED), the plasma display panel (or 'PDF'), the electro-luminescence device (or 'EL') and so on. Especially, the high quality flat panel displays adopting the low temperature poly-silicon (or, LTPS) to the active channel layer are developing.

As a self-emitting display device, the electro-luminescence device has the merits that the response speed is very fast, the brightness is very high and the view angle is large. The electro-luminescence device can be categorized an inorganic light emitting diode display and an organic light emitting diode display. As having the good energy efficiencies, the lower leaked current and the easiness for representing color and brightness by current controlling, the OLED using the organic light emitting diode is more required.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the excition formed at the excitation state in which the hole and the electron are recombined at the emission layer EML.

The organic light emitting diode radiates the lights due to the energy from the excition formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLEDD) can be categorized a passive matrix type organic light emitting diode display (or PMOLED) and an active matrix type organic light emitting diode display (or AMOLED).

The active matrix type organic light emitting diode display (or AMOLED) shows the video data by controlling the current applying to the organic light emitting diode using the thin film transistor (or TFT).

FIG. 2 is the exemplary circuit diagram illustrating the structure of one pixel in the active matrix organic light emitting diode display (or AMOLED). FIG. 3 is a plane view illustrating the structure of the organic light emitting diode display (or OLED) according to the related art. FIG. 4 is a cross sectional view along the cutting line I-I' of FIG. 3, for illustrating the structure of the bottom emission type organic light emitting diode display according to the related art.

Referring to FIGS. 2 and 3, the active matrix organic light emitting diode display comprises a switching thin film transistor ST, a driving thin film transistor DT connected to the switching thin film transistor ST, and an organic light emitting diode OLE connected to the driving thin film transistor DT. The pixel areas are defined by the arrangement of the scan line SL, the data line DL and the driving current line VDD on the substrate SUB. The light emitting area is defined by the organic light emitting diode OLE formed within the pixel area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. The organic light emitting layer OL is inserted between the anode electrode ANO and the cathode electrode CAT. The cathode electrode CAT is connected to the base voltage node VSS. A storage capacitance Cst is formed between the gate electrode DG of the driving thin film transistor DT and the driving current line VDD or between the gate electrode DG of the driving thin film transistor DT and the drain electrode DD of the driving thin film transistor DT.

Referring to FIG. 4, we will explain about the bottom emission type organic light emitting diode display in detail. On the substrate SUB, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. It is preferable that the organic light emitting layer OL is coated on a surface having an even and/or smooth conditions to ensure the superior quality of light emission. So, to make the upper surface in planar and even conditions, the over coat layer OC is deposited on the whole surface of the substrate OC.

Then, on the over coat layer OC, the anode electrode ANO of the organic light emitting diode OLE is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BN is formed over the area having the switching thin film transistor ST, the driving thin film transistor DT and the various lines DL, SL and VDD, for defining the light emitting area. The exposed portion of the anode electrode ANO by the bank BN would be the light emitting area. On the anode electrode ANO exposed by the bank BN, an organic light emitting layer OL is deposited. On the organic light emitting layer OL, a cathode electrode CAT is deposited.

A spacer SP is disposed on the substrate SUB having the cathode electrode CAT. It is preferable that the space SP is disposed on the bank BN defining the non emitting area. With the space SP, an en-cap ENC, at the upper side is joined with the substrate SUB, at the lower side. In order to adhere to the en-cap ENC and the substrate SUB, an adhesive layer or an adhesive material (not shown) may be further inserted between them.

For the bottom emission type full color organic light emitting diode display, the lights generated from the organic light emitting layer OL are radiated to the substrate SUB. Therefore, it is preferable that a color filter CF is disposed between the over coat layer OC and the passivation layer PAS, and the anode electrode ANO is formed of a transparent material. Further, to reflect the lights from the organic light emitting layer OL to the lower direction, the cathode electrode CAT may be made of a metal material having superior reflection property. In addition, the organic light emitting layer OL may have an organic material representing white color light. The organic light emitting layer OL and the cathode electrode CAT may be deposited over the most surface of the substrate SUB.

The cathode electrode CAT is the electrode for maintaining the base voltage of the organic light emitting diode OLD. To operate the organic light emitting diode OLD in stable condition, it is preferable that the base voltage is kept in continuous level without any fluctuation. Therefore it is preferable that the cathode electrode CAT is formed by depositing a low resistance metal material over the most surface of the substrate SUB.

Referring to FIG. 4, the cathode electrode CAT fully covers the data lines DL and the driving current lines VDD. Between the cathode electrode CAT and the data line DL and between the cathode electrode CAT and the driving current line VDD, the passivation layer PAS, the overcoat layer OC and the bank BN are disposed. For developing the organic light emitting diode display having the ultra high resolution of UHD rate or higher, the lines DL and VDD have the high RC (resistance-capacitance) load (or electric resistance).

For the organic light emitting diode display as shown in FIG. 4, the parasitic capacitances formed between the cathode electrode CAT and the data line DL and between the cathode electrode CAT and the driving current line VDD occupy at least 30% of whole amount of the parasitic capacitance. For the display having the ultra high resolution of UHD rate, the signal delay may be caused by the RC load between the cathode electrode CAT and the data line DL and between the cathode electrode CAT and the driving current line VDD, so that the correct video data might not be supplied to the pixel.

In addition, as the organic light emitting diode display has the characteristics of the electric current operation, when the voltage programming has the deviations; it causes the difference of the luminance. As the RC load is increased, the time interval for data programming is also increased. That is, the time for charging the data voltage is increased. The high speed operation is hindered.

SUMMARY

Accordingly, embodiments of the present disclosure are directed to an organic light emitting diode display that substantially obviates one or more of the problems due to limitations and disadvantages of the related art.

An aspect of the present disclosure is to provide an organic light emitting diode display having the superior video quality in ultra high resolution and high speed operation. Another purpose of the present disclosure is to provide an organic light emitting diode display in which the RC load is reduced by lowering the parasitic capacitance between the cathode electrode and the data line and between the cathode electrode and the driving current line.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting diode display comprises a substrate; a buffer layer on the substrate; a scan line running to a horizontal direction on the buffer layer; an intermediate insulating layer covering the scan line; a first trench having a segment shape apart from the scan line with a predetermined distance and exposing some of the substrate by patterning the intermediate insulating layer and the buffer layer; a data line running to a vertical direction on the substrate exposed by the first trench and on the intermediate insulating layer; a passivation layer covering the data line and the scan line; and a color filter filling into the trench and depositing on the passivation layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
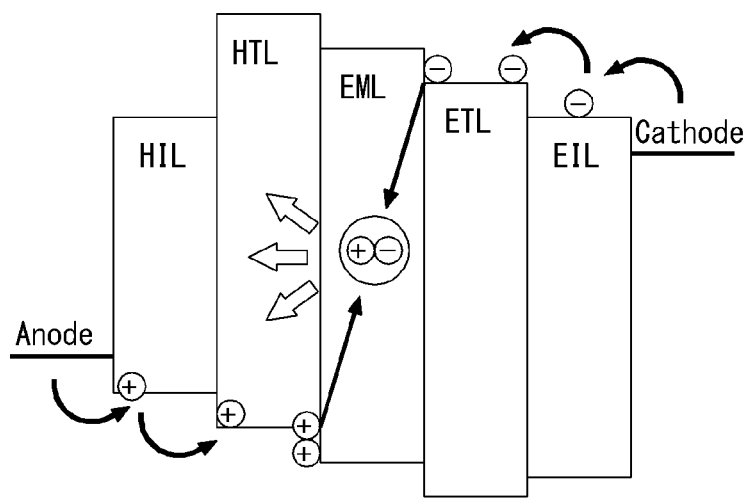
FIG. 1 is a diagram illustrating the structure of the organic light emitting diode according to the related art.
Figure 2:
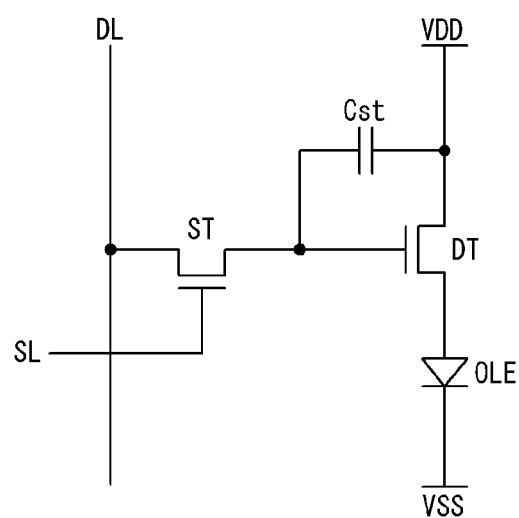
FIG. 2 is the exemplary circuit diagram illustrating the structure of one pixel in the organic light emitting diode display according to the related art.
Figure 3:
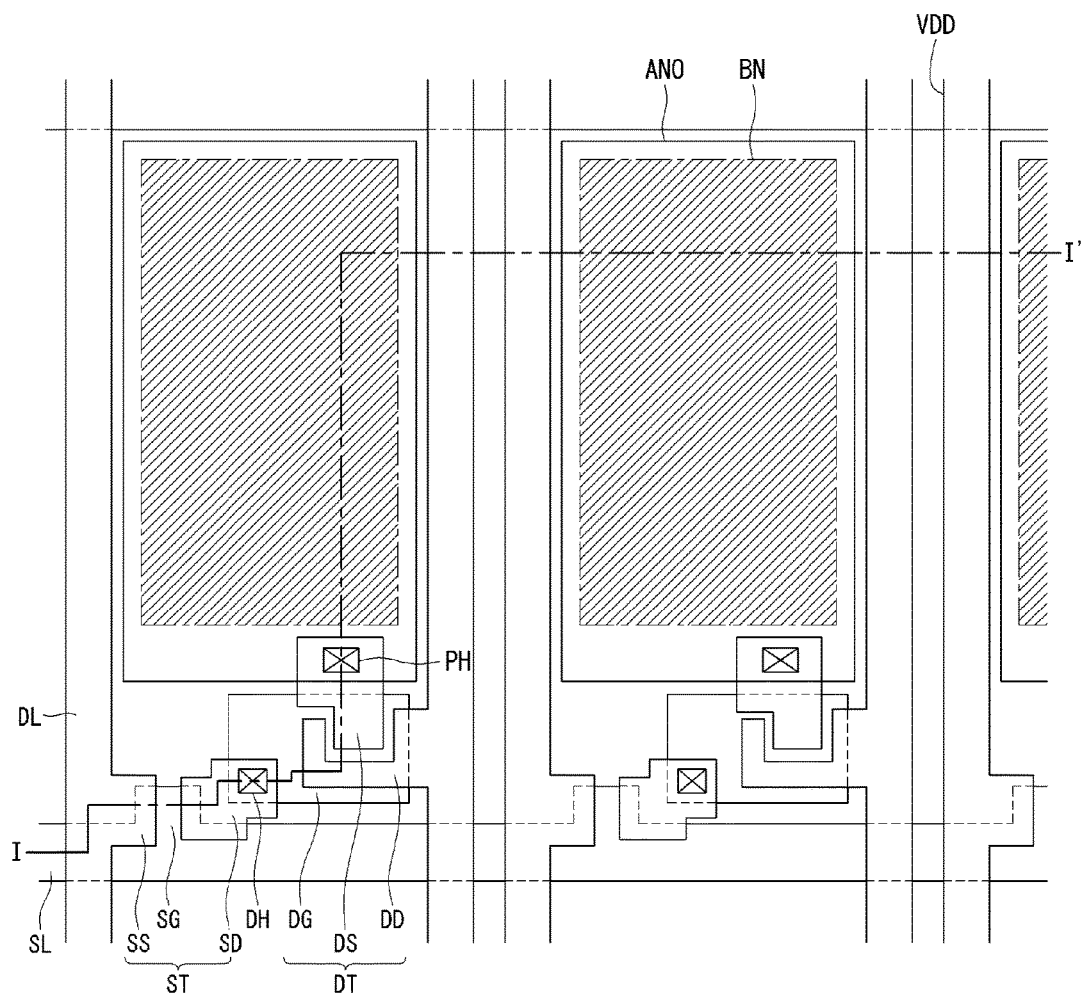
FIG. 3 is a plane view illustrating the structure of an organic light emitting diode display having a thin film transistor according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
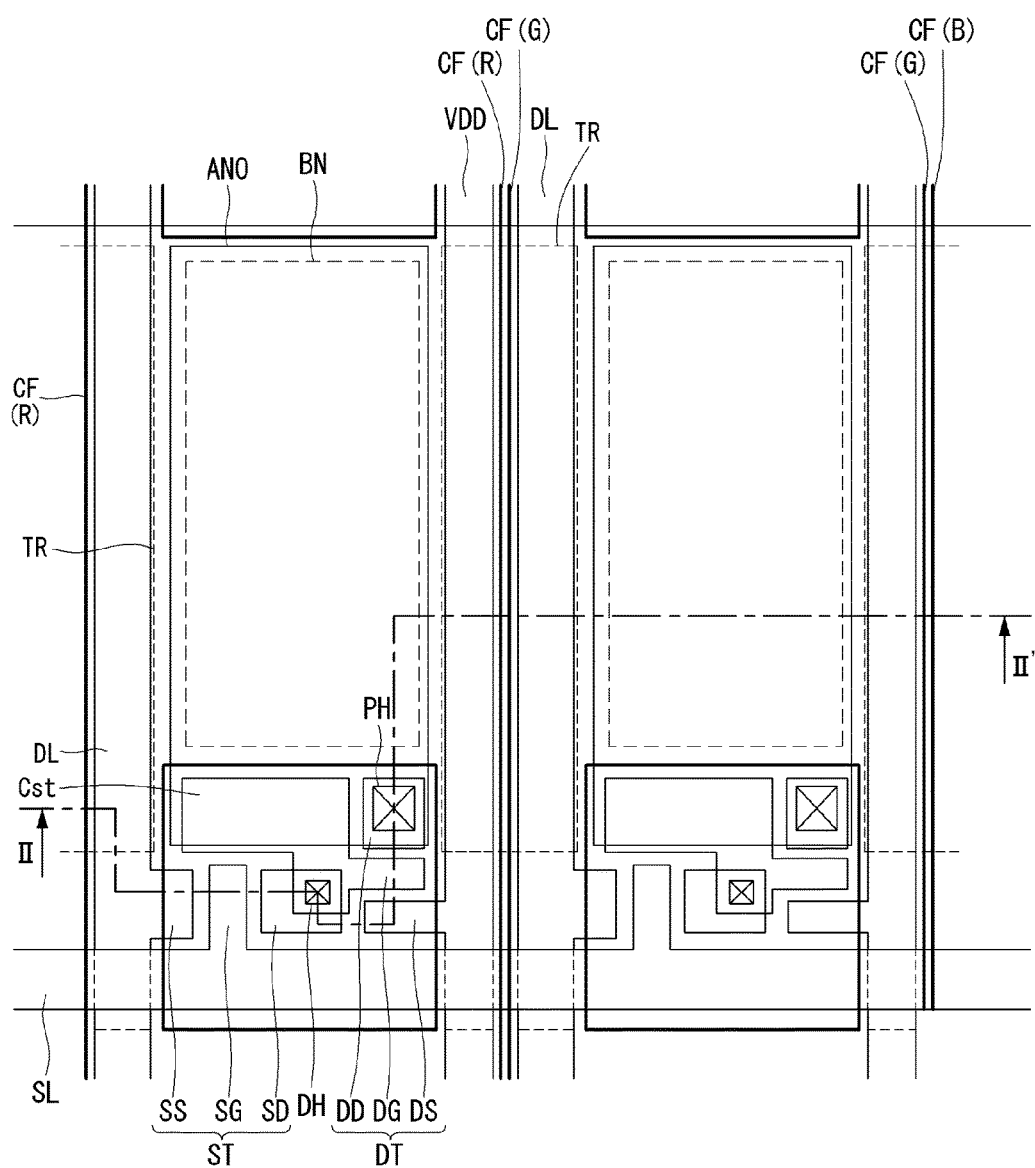
FIG. 5 is a plane view illustrating a structure of an organic light emitting diode display having thin film transistor according to a preferred embodiment of the present disclosure.
Figure 6:
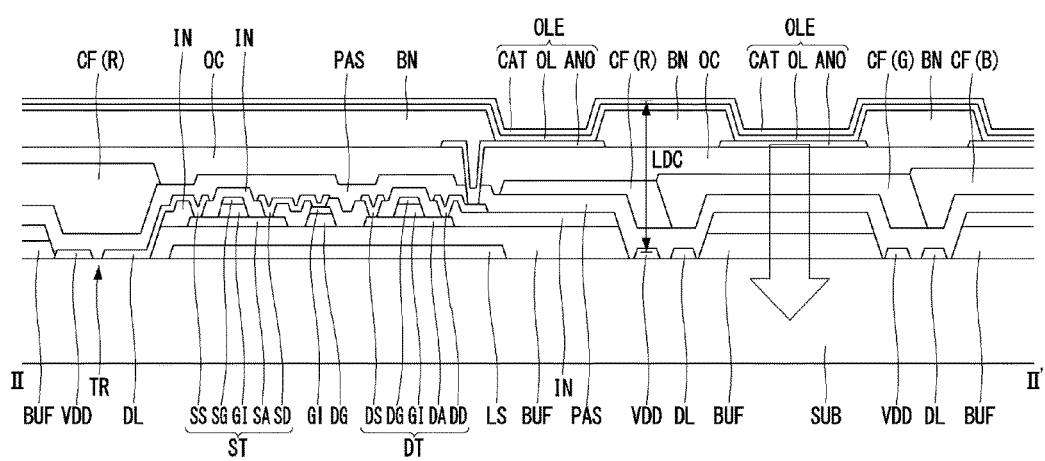
FIG. 6 is a cross sectional view along the cutting line of II-II' in FIG. 5 for illustrating the structure of a bottom emission type organic light emitting diode display according to the preferred embodiment of the present disclosure.

Hereinafter referring to FIGS. 5 and 6, we will explain about a preferred embodiment of the present disclosure. FIG. 5 is a plane view illustrating a structure of an organic light emitting diode display having thin film transistor according to a preferred embodiment of the present disclosure. FIG. 6 is a cross sectional view along the cutting line of II-II' in FIG. 5 for illustrating the structure of a bottom emission type organic light emitting diode display according to the preferred embodiment of the present disclosure.

Referring to FIG. 5, the active matrix organic light emitting diode display comprises a plurality of pixel areas arrayed in a matrix manner on a substrate SUB. One pixel area is defined as an area surrounded by a scan line SL running in horizontal direction and a data line DL and a driving current line VDD running in vertical direction. In the pixel area, a switching thin film transistor ST, a driving thin film transistor DT connected to the switching thin film transistor ST, and an organic light emitting diode OLE connected to the driving thin film transistor DT are disposed. An emission area is defined as the organic light emitting diode OLE is formed within the pixel area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the scan line SL, a semiconductor channel layer SA overlapping with the gate electrode SG, a source electrode SS and a drain electrode SD.

The driving thin film transistor DT acts for driving the organic light emitting diode OLE disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD.

The drain electrode DD of the driving thin film transistor DT is connected to the anode electrode ANO of the organic light emitting diode OLE. Between the anode electrode ANO and the cathode electrode CAT, an organic light emitting layer OL is disposed. The base voltage VSS is supplied to the cathode electrode CAT. A storage capacitance Cst is formed between the gate electrode DG of the driving thin film transistor DT and the driving current line VDD or between the gate electrode DG of the driving thin film transistor DT and the drain electrode DD of the driving thin film transistor DT.

At each pixel area, a color filter CF is disposed. Especially, it is preferable that the color filter CF fills the whole of one pixel area. For example, the data line DL is disposed at the left side of one pixel area and the driving current line VDD is disposed at the right side of the pixel area. At upper side and the lower side of the pixel area, one scan line SL is disposed, respectively. As one pixel area has any one color filter CF, the color filter CF covers the data line DL, the driving current line VDD and the lower scan line SL, and fills inside of the pixel area.

For another example, one color filter CF may be disposed at every pixel column. In this case, the color filter CF may cover the data line DL disposed at left side and the driving current line VDD disposed at right side, as filling whole area of one column of pixel areas. The upper and lower scan lines SL are both covered by the same color filter CF.

A red color filter CF(R), a green color filter CF(G) and a blue color filter CF(B) are alternatively arrayed as one of them is filled in any one pixel areas. In some cases, a white color filter may be added. In FIG. 5, for convenience, it is shown that one color filter CF is allocated at one pixel area.

In addition, the color filter CF may not be disposed at the portions where the thin film transistors ST and DT are formed. For example, the color filter CF may cover the anode electrode ANO of the organic light emitting diode OLE, the data line DL disposed at left side, the driving current line VDD disposed at right side and some of the scan line SL, does not cover the thin film transistors ST and DT and the storage capacitance Cst. The thin film transistors ST and DT may have contact holes DH and PH. When the color filter CF does cover the thin film transistors ST and DT, it is very hard to form the contact holes DH and PH. Therefore, it is preferable that the color filter CF does not cover the thin film transistors ST and DT.

Hereinafter, referring to FIG. 6, we will explain about the structure of the bottom emission type organic light emitting diode display in detail. On the substrate SUB, a light shielding layer LS is disposed at first. The light shielding layer LS is for preventing the lights from outside being intruding into the channel areas of the thin film transistors.

For an ultra high resolution organic light emitting diode display, it is preferable that the poly crystalline semiconductor material having merits for high speed operation is adapted to the channel layer. For the poly crystalline semiconductor material, it is preferable that the thin film transistor has a top gate structure for ensuring the manufacturing merits. For the case of the bottom emission type display with the top gate structure thin film transistor, the semiconductor channel layer may be exposed to the external lights easily. To protect the channel layer from the external lights, it is preferable that the light shielding layer LS is firstly formed where the thin film transistor would be formed later on the substrate SUB.

On the surface of the substrate SUB having the light shielding layer LS, a buffer layer BUF is deposited. On the buffer layer BUF, the semiconductor layer SA of the switching thin film transistor ST and the semiconductor layer DA of the driving thin film transistor DT are formed. Especially, it is preferable that the semiconductor layers SA and DA are disposed within the area covered by the light shielding layer LS. At the central portions of the semiconductor layers SA and DA, the gate electrodes SG and DG are formed as overlapping the semiconductor layers SA and DA with the gate insulating layer GI there-between.

An intermediate insulating layer IN is deposited on the substrate SUB having the semiconductor layers SA and DA and the gate electrodes SG and DG. The intermediate insulating layer IN is for ensuring the insulating property between the scan line SL and the data line DL and between the scan line SL and the driving current line VDD. The intermediate insulating layer IN has the contact holes for exposing some of the semiconductor layers SA and DA and for exposing the gate electrode SG of the switching thin film transistor ST. With the contact holes, the trenches TR are formed. It is preferable that the trench TR is formed by patterning the intermediate insulating layer IN and the buffer layer BUF there-under.

For example, the trench TR may have a segment shape corresponding to the shapes of the data line DL and the driving current line VDD. As the data line DL and the driving current line VDD are crossing with the scan line SL, the trench TR does not have a long line crossing the whole length of the substrate SUB along to the vertical direction. It is preferable that the trench TR has a short segment between two neighboring scan lines SL in vertical direction. A plurality of trenches TR makes a series of segments along to the vertical line. Within the trench TR, the data line DL and the driving current line VDD are disposed.

Most portions of the data line DL and the driving current line VDD may be directly contact the upper surface of the substrate SUB exposed by the trenches TR. However, at the crossing portion with the scan line SL, they are disposed on the intermediate insulating layer IN. The source electrode SS of the switching thin film transistor ST branched from the data line DL may be disposed on the intermediate insulating layer IN. Further, the source electrode DS of the driving thin film transistor DT branched from the driving current line VDD may be also disposed on the intermediate insulating layer IN. As well, the drain electrodes SD and DD may be disposed on the intermediate insulating layer IN. In addition, the source electrodes SS and DS and the drain electrodes SD and DD are contacting the one side and the other side of the semiconductor layers SA and DA through the contact holes formed at the intermediate insulating layer IN, respectively. Further, the drain electrode SD of the switching thin film transistor ST contacts the gate electrode DG of the driving thin film transistor DT through the drain contact hole DH formed at the intermediate insulating layer IN.

A passivation layer Pas is deposited on the whole surface of the substrate SUB having the thin film transistors ST and DT, the data line DL and the driving current line VDD. The passivation layer PAS may have the step coverage of the trenches TR.

A color filter CF is disposed on the passivation layer PAS. It is preferable that the color filter CF has a slightly larger area than the anode electrode ANO formed later. Further, it is preferable that the color filter CF covers the whole of the trenches TR. However, it is preferable that the color filter CF does not cover the thin film transistors ST and DT. As the color filter CF includes an organic material, it is coated as filling the inside of the trenches TR and spreading over the coated area so that the top surface of the color filter CF has the even height over the coated areas. That is, the color filter CF may be coated over the passivation layer PAS as filling the trenches TR.

At each pixel areas, any one of the red color filter CF(R), the green color filter CF(G) and the blue color filter CF(B) is allocated. Within any one trench TR, a data line DL of one pixel and a driving current line VDD of the left next pixel are disposed. Therefore, within any one trench TR, two color filters CF may be filled. In another instance, within any one trench TR, any one color filter CF may be filled only. FIG. 6 shows that two neighboring color filters CF fill in any one trench TR.

The substrate SUB having the thin film transistors ST and DT may have uneven surface condition. As the color filters CF are disposed, the surface of the substrate may have somewhat even condition. However, as the color filter CF does not cover the thin film transistors ST and DT, the top surface still has uneven condition. It is preferable that the organic light emitting layer OL is disposed on a surface having an even and/or smooth conditions to ensure the superior quality of light emission. So, to make the upper surface in planar and even conditions, the over coat layer (or, planar layer) OC is deposited on the whole surface of the substrate OC.

An anode electrode ANO of the organic light emitting diode OLE is formed on the overcoat layer OC. Here, the anode electrode ANO is connected to the drain electrode DD of the driving thin film transistor DT via a pixel contact hole PH formed at the overcoat layer OC and the passivation layer PAS.

A bank BN covering the switching thin film transistor ST, the driving thin film transistor DT and the lines DL, SL and VDD is formed on the substrate SU having the anode electrode ANO as defining an emission area. The exposed portions of the anode electrode ANO is defined as the emission area. An organic light emitting layer OL is disposed on the whole surface of the substrate SUB having the bank BN. A cathode electrode CAT is deposited on the whole surface of the substrate SUB having the organic light emitting layer OL.

The organic light emitting diode OLE is formed by the anode electrode ANO exposed by the bank BN, the organic light emitting layer OL stacked on the anode electrode ANO and cathode electrode CAT stacked on the light emitting layer OL. As radiating the lights from the organic light emitting diode OLE to the color filter CF, the bottom emission type organic light emitting diode display is formed.

As shown in FIG. 6, the organic light emitting diode display according to the present disclosure has the structure in which the data line DL and the driving current line VDD are buried into the trenches TR formed by patterning the intermediate insulating layer IN and the buffer layer BUF. Further, the trenches TR having the data line DL and the driving current line VDD is covered by the color filters CF. As the results, the passivation layer PAS, the color filter CF, the overcoat layer OC and the bank BN are stacked between the cathode electrode CAT and the data line DL and between the cathode electrode CAT and the driving current line VDD. Especially, as the color filter CF is filling into the trench TR, this portion of the color filter CF is thicker than other portions. For example, the thickness of the color filter CF filling the trench TR is thicker than the thickness of the color filter CF stacked under the anode electrode ANO with the thicknesses of the patterned portion of the intermediate insulating layer IN and the buffer layer BUF.

Figure 4:
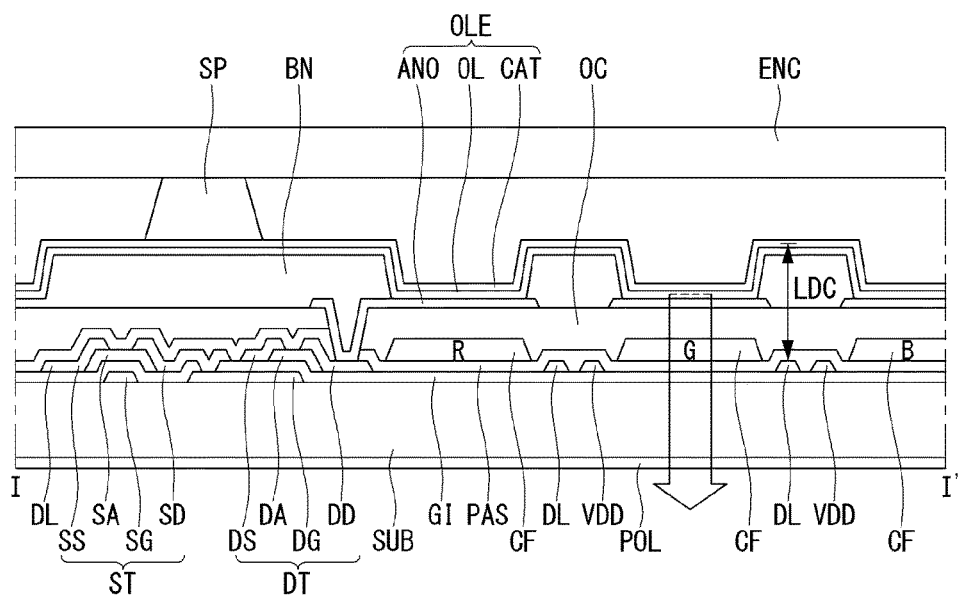
FIG. 4 is a cross sectional view along the cutting line I-I' of FIG. 3, for illustrating the structure of a bottom emission type organic light emitting diode display according to the related art.

By comparing FIG. 6 with FIG. 4, it is clear that the distance LDC between the data line DL and the cathode electrode CAT according to the present disclosure is much longer than the distance LDC between the data line DL and the cathode electrode CAT according to the related art.

Further, as the color filter CF having relatively higher dielectric permittivity than other elements is filling into the trench TR, the superior insulating property would be ensured between the data line DL and the cathode electrode CAT.

For the organic light emitting diode display according to the present disclosure, the RC delay on the data line DL and/or the driving current line VDD may be eliminated or minimized. As the results, the data charging characteristics would be superior and proper to conduct the high speed operation. For the case of the DRD structure in which one data line is commonly used to horizontally neighboring two pixels, the data programming requires twice higher speed than normal structure. Applying the features of the present disclosure to the DRD structure, the data signal delay might be eliminated or minimized so the high speed data programming is acquired. That is, the present disclosure provides an organic light emitting diode display having uniformed luminance property and high speed operation.

Further, when manufacturing an organic light emitting diode display having an ultra high density resolution of UHD rate or higher, the numbers of the data lines DL and the driving current lines VDD are increasing remarkably. As numbers of lines are increasing, the total areas of the overlapped portions with the cathode electrode CAT are increasing, so that the parasitic capacitance would be remarkably increased. This causes the signal delay on the data line and it affects defected effects on the quality of the display such as the high differences of the luminance. When applying the features of the present disclosure to the organic light emitting diode display having an ultra high resolution of UHD rate or higher, the amount of the parasitic capacitance formed between the cathode electrode CAT and the data line DL and between the cathode electrode CAT and the driving current line VDD would be minimized. Therefore, the present disclosure provides an organic light emitting diode display having an ultra high density resolution and the superior video quality.

In accordance with example embodiments of the present disclosure, a bottom emission type organic light emitting diode display having the top gate thin film transistor has been explained. However, the features of the present disclosure may be applied to the bottom emission type organic light emitting diode display having the bottom gate thin film transistor. For example, a buffer layer may be first deposited on the substrate excepting the light shielding layer. The gate electrode and the scan line may be formed on the buffer layer BUF. Then, the gate insulating layer and the semiconductor layer may be formed. After that, the source electrode, the drain electrode and the data line may be formed. Before forming the data line, the trenches may be formed by patterning the gate insulating layer and the buffer layer so that the data line is buried into the trenches. Depositing the passivation layer and the color filters, the data line may be covered by the thick color filter.

In accordance with example embodiments, the present disclosure provides an organic light emitting diode display in which the parasitic capacitance is reduced and the RC load is lowered by inserting a color filter having high dielectric permittivity between the cathode electrode and the data line and between the cathode electrode and the driving current line. According to the present disclosure, a trench is formed by selectively removing some portions of the insulating layer and the buffer layer under the data line and the driving current line, so that most of the data line and the driving current line are buried into the trench. Further, a color filter is disposed over the data line and the driving current line. As the results, the insulating distance between the cathode electrode and the data line and between the cathode electrode and the driving current line is maximized. With this structure, the parasitic capacitances between the cathode electrode and the data line and between the cathode electrode and the driving current line are eliminated so that the RC loads of the data line and the driving current line are minimized. As the results, the data line charging characteristics are enhanced, so that this structure is proper to the ultra high resolution and high speed operation display. For the ultra high resolution of UHD rate or higher, even though the area ratio of the overlapped portion between the cathode electrode and the data line and between the cathode electrode and the driving current line is increased, the parasitic capacitance may be eliminated or minimized. Therefore, the superior quality of display may be provided. Further, the present disclosure provides an organic light emitting diode display in which the data signal has no time delay at high speed operation, so that the luminance uniformity is ensured.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display, comprising:
   a substrate;
   a buffer layer on the substrate;
   a scan line running in a horizontal direction on the buffer layer;
   an intermediate insulating layer covering the scan line;
   a first trench having a segment shape apart from the scan line with a predetermined distance, and exposing some of the substrate by patterning the intermediate insulating layer and the buffer layer;
   a data line running in a vertical direction on the substrate exposed by the first trench and on the intermediate insulating layer;
   a passivation layer covering the data line and the scan line;
   a color filter filling the trench and deposited on the passivation layer; and
   a driving current line parallel with the data line, and running in a vertical direction on the some of the substrate exposed by the first trench and on the intermediate insulating layer,
   wherein the passivation layer covers the driving current line.

2. The device according to the claim 1, further comprising:
   a second trench having a segment shape apart from the scan line with a predetermined distance and exposing some of the substrate by patterning the intermediate insulating layer and the buffer layer.

3. The device according to the claim 2, further comprising:
   a pixel area defined by the scan line, the data line and the driving current line;
   an overcoat layer covering the most of the substrate on the color filter;
   an anode electrode disposed within the pixel area on the overcoat layer;
   a bank defining an emission area within the anode electrode;
   an organic light emitting layer covering the anode electrode and the bank; and a cathode electrode deposited on the organic light emitting layer.

4. The device according to the claim 3, further comprising:
- a switching thin film transistor connected between the scan line and the data line; and
- a driving thin film transistor connected between the driving current line and the switching thin film transistor,
- wherein the anode electrode is connected to the driving thin film transistor.

5. The device according to the claim 3, wherein the passivation layer, the color filter, the overcoat layer, the bank and the organic light emitting layer are stacked between the data line and the cathode electrode.

6. The device according to the claim 3, wherein the data line is running to a vertical direction,
- wherein the data line is buried into the trench, and is disposed on the intermediate insulating layer where the data line is overlapped with the scan line, and
- wherein a first distance between the data line and the cathode electrode at a first location where the trench is disposed is thicker than a second distance between the data line and the cathode electrode at a second location where the data line is overlapped the scan line, the thickness difference is corresponding to a depth of the trench.

7. The device according to the claim 2, wherein the color filter fills into the trench and is disposed as overlapped with the anode electrode, the data line and the driving current line.

8. The device according to the claim 7, wherein the color filter has a first thickness over the trench is thicker than a second thickness under the anode electrode, and
- wherein a difference between the first thickness and the second thickness is corresponding to a depth of the trench.

9. The device according to the claim 1, wherein a plurality of the scan lines are arrayed with a predetermined distance from each other, and
- wherein the trench has a segment shape running in the vertical direction between two neighboring two scan lines, and
- wherein a plurality of the trenches are disposed along to the data line.

10. The device according to the claim 1, wherein each of a width of the data line and a width of the driving current line is smaller than a width of the trench.

11. The device according to the claim 10, wherein the data line and the driving current line are both disposed in the trench.

12. The device according to the claim 1, wherein the driving current line is in direct contact with the substrate.

* * * * *